United States Patent
Prather et al.

(10) Patent No.: US 11,783,882 B2
(45) Date of Patent: Oct. 10, 2023

(54) REFRESH OPERATION IN MULTI-DIE MEMORY

(71) Applicant: Micron Technology, Inc., Boise, ID (US)

(72) Inventors: Matthew A. Prather, Boise, ID (US); Thomas H. Kinsley, Boise, ID (US)

( * ) Notice: Subject to any disclaimer, the term of this patent is extended or adjusted under 35 U.S.C. 154(b) by 0 days.

(21) Appl. No.: 17/379,422

(22) Filed: Jul. 19, 2021

(65) Prior Publication Data

US 2021/0350842 A1    Nov. 11, 2021

Related U.S. Application Data

(63) Continuation of application No. 16/562,940, filed on Sep. 6, 2019, now Pat. No. 11,069,394.

(51) Int. Cl.
| | |
|---|---|
| *G11C 7/00* | (2006.01) |
| *G11C 11/406* | (2006.01) |
| *G11C 7/10* | (2006.01) |
| *G11C 11/407* | (2006.01) |

(52) U.S. Cl.
CPC ...... *G11C 11/40611* (2013.01); *G11C 7/1072* (2013.01); *G11C 11/407* (2013.01)

(58) Field of Classification Search
CPC .............................................. G11C 11/40611
See application file for complete search history.

(56) References Cited

U.S. PATENT DOCUMENTS

| | | | |
|---|---|---|---|
| 7,881,140 B2* | 2/2011 | Yang | G11C 8/12 365/205 |
| 8,264,903 B1 | 9/2012 | Lee et al. | |
| 8,599,634 B1 | 12/2013 | Lee et al. | |
| 11,069,394 B2* | 7/2021 | Prather | G11C 7/1072 |
| 2006/0069855 A1 | 3/2006 | Ha et al. | |
| 2007/0195613 A1* | 8/2007 | Rajan | G06F 12/00 365/230.03 |
| 2008/0028137 A1* | 1/2008 | Schakel | G11C 7/04 711/106 |
| 2008/0062797 A1* | 3/2008 | Hearn | G11C 11/40618 365/222 |
| 2010/0054066 A1* | 3/2010 | Kajigaya | G11C 8/08 365/207 |
| 2011/0252193 A1 | 10/2011 | Bains et al. | |

(Continued)

OTHER PUBLICATIONS

International Application No. PCT/US2020/044796—PCT International Search Report and Written Opinion, dated Nov. 3, 2020, 12 pages.

(Continued)

*Primary Examiner* — Min Huang
(74) *Attorney, Agent, or Firm* — Holland & Hart LLP (57) ABSTRACT

Methods, apparatuses, and systems for staggering refresh operations to memory arrays in different dies of a three-dimensional stacked (3DS) memory device are described. A 3DS memory device may include one die or layer of that controls or regulates commands, including refresh commands, to other dies or layers of the memory device. For example, one die of the 3DS memory may delay a refresh command when issuing the multiple concurrent memory refreshes would cause some problematic performance condition, such as high peak current, within the memory device.

16 Claims, 7 Drawing Sheets

(56) References Cited

U.S. PATENT DOCUMENTS

| | | |
|---|---|---|
| 2013/0272082 A1* | 10/2013 | Kim ................ G11C 11/402 |
| | | 365/222 |
| 2014/0003171 A1 | 1/2014 | Ko |
| 2014/0071778 A1* | 3/2014 | Coteus ............ G06F 13/1668 |
| | | 365/222 |
| 2014/0126311 A1 | 5/2014 | Im |
| 2014/0192606 A1 | 7/2014 | Kang et al. |
| 2015/0109871 A1 | 4/2015 | Bains et al. |
| 2015/0127898 A1 | 5/2015 | Cordero et al. |
| 2015/0127899 A1 | 5/2015 | Cordero et al. |
| 2018/0096719 A1 | 4/2018 | Tomishima et al. |
| 2019/0189194 A1 | 6/2019 | Kim et al. |
| 2021/0074348 A1 | 3/2021 | Prather et al. |

OTHER PUBLICATIONS

Korean Patent Application No. 10-2022-7010825, Korean Office Action, dated Jul. 20, 2022, with English Translation, 8 pages.

\* cited by examiner

REFRESH OPERATION IN MULTI-DIE MEMORY

CROSS-REFERENCE TO RELATED APPLICATION(S)

This application is a continuation of U.S. patent application Ser. No. 16/562,940, filed Sep. 6, 2019; which is incorporated herein by reference in its entirety.

TECHNICAL FIELD

The present disclosure generally relates to semiconductor memory devices, and more particularly relates to systems and methods for refreshing multi-die memory.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random-access memory (SRAM), dynamic random-access memory (DRAM), and synchronous dynamic random-access memory (SDRAM), among others, can require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, can include increasing memory cell density, increasing read/write speeds or otherwise reducing operational latency, increasing reliability, increasing data retention, reducing power consumption, or reducing manufacturing costs, among other metrics.

DETAILED DESCRIPTION

DRAM memories need to periodically refresh the memory arrays to preserve the information in the memory by reading the information from the arrays and immediately rewriting the read information to the same areas without modification. Because refresh is power intensive, having multiple refresh operations occurring simultaneously in a memory device can require more power than is normally budgeted for operation. A monolithic device (e.g., a memory device comprising a single silicon die) can be configured to handle this by staggering the activate commands for the rows being refreshed to keep the power consumption within budget. For a multi-chip device, however, this staggering approach can be problematic—a delayed activate command from one die may directly coincide in time with an activate command from another die, causing the power requirements to exceed the normal power budget, which can, for example, detrimentally increase the voltage noise experienced by the memory device (interfering with reliable data communication and/or storage), or exceed a power level the host system can provide (potentially causing catastrophic failure).

To address the foregoing problem, systems and methods for refreshing multi-die memories are disclosed herein. Concurrent refresh or simultaneous refresh operations to multiple dies in a three-dimensional stacked (3DS) memory devices are staggered by delaying subsequent refresh commands to a memory array of the 3DS memory device when a preceding refresh command to another memory array of the 3DS memory device is ongoing. According to one embodiment, the master device delays refresh commands targeted at a memory array in a die to ensure that there are no overlapping refresh operations that can lead to high instantaneous peak current demands from the 3DS memory device.

As will be discussed further below, elements of the presently disclosed technology described in the context of paragraphs and/or Figures can be combined with elements described in the context of other paragraphs and/or Figures. Furthermore, not all elements of the technology disclosed herein are required to practice the technology. Additionally, several details describing structures and/or processes that are well-known and often associated with memory devices, but that may unnecessarily obscure some significant aspects of the present technology, are not set forth in the following description for purposes of clarity. Moreover, although the following disclosure sets forth several embodiments of the present technology, several other embodiments of the technology have different configurations or different components than those described in this section. As such, the present technology can have other embodiments, with additional elements and/or without several of the elements described below with reference to the figures.

Figure 1:
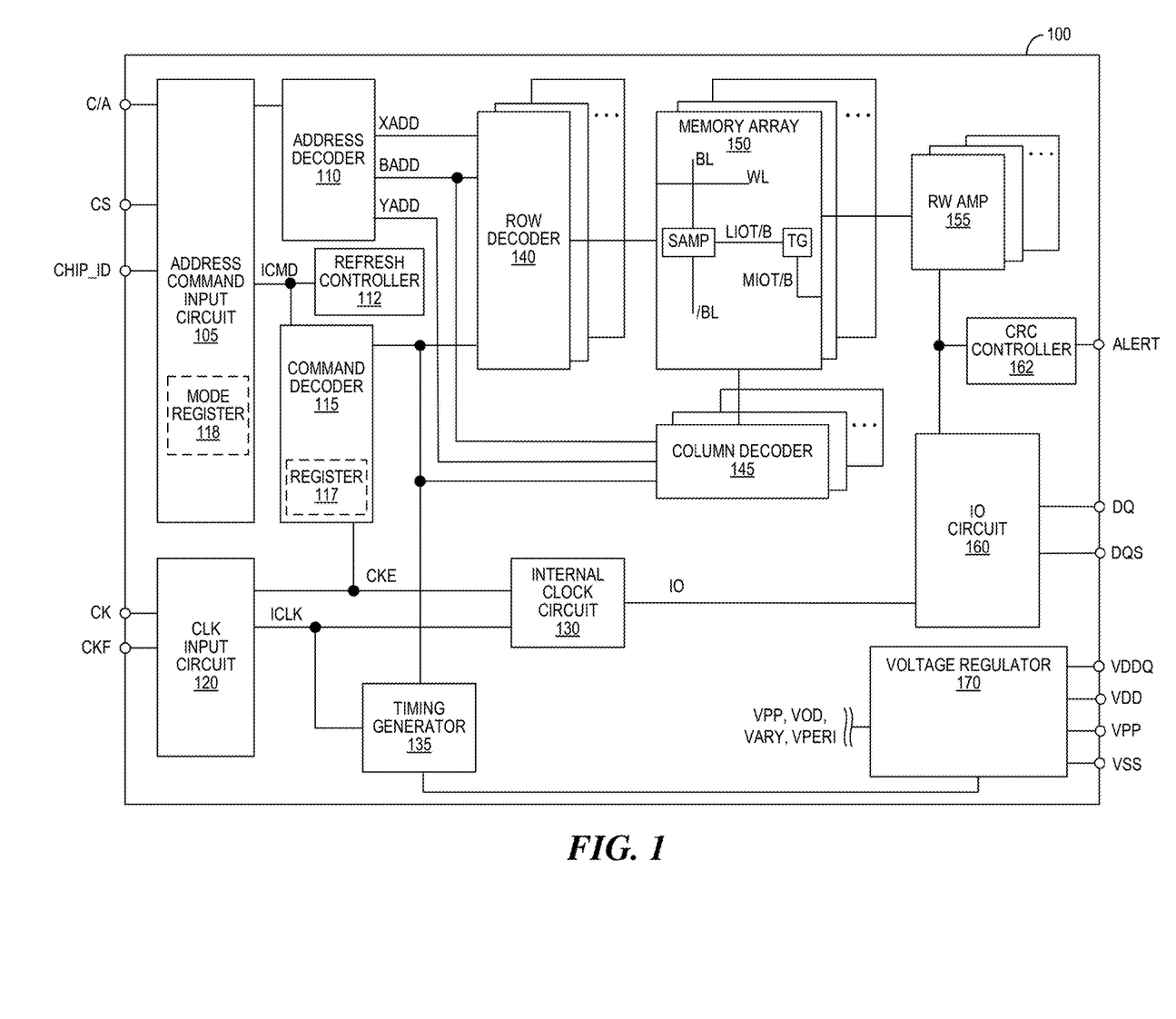
FIG. 1 is a representative block diagram schematically illustrating a memory device.

FIG. 1 is a block diagram schematically illustrating a memory device 100 in accordance with an embodiment of the present technology. The memory device 100 can include an array of memory cells, such as memory array 150. The memory array 150 can include a plurality of banks, and each bank can include a plurality of word lines (WL), a plurality of bit lines (BL), and a plurality of memory cells arranged at intersections of the word lines and the bit lines. Memory cells can include any one of different memory media types, including capacitive, magnetoresistive, ferroelectric, phase change, or the like. The selection of a word line WL can be performed by a row decoder 140, and the selection of a bit line BL can be performed by a column decoder 145. Sense amplifiers (SAMP) can be provided for corresponding bit lines BL and connected to at least one respective local I/O line pair (LIOT/B), which can in turn be coupled to at least respective one main I/O line pair (MIOT/B), via transfer gates (TG), which can function as switches. The memory array 150 can also include plate lines and corresponding circuitry for managing their operation.

The memory device 100 can employ a plurality of external terminals that include command and address terminal (C/A) coupled to a command bus and an address bus to receive command signals (CMD) and address signals (ADDR). The memory device can further include a chip select terminal to receive a chip select signal CS, a chip identifier terminal to receive a chip ID signal CHIP_ID, clock terminals to receive clock signals CK and CKF, data terminals DQ and DQS, power supply terminals VDD, VSS, VDDQ, and VPP.

The command and address terminal (C/A) can be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command/address input circuit 105 can be supplied with command and address signals C/A, chip identifier signals CHIP_ID, and chip selection signals CS, from a memory controller, host, CPU, or SOC. In some embodiments, CHIP_ID is part of the C/A bus and in other embodiments CHIP_ID is a standalone input. The command signals can represent various memory commands from the memory controller (e.g., including access commands, which can include read commands and write commands and commands to refresh the memory array). The select signal CS and chip identifier CHIP_ID signals can be used to select the memory device 100 to respond to commands and addresses provided to the command and address terminal. When an active CS and CHIP_ID signal is provided to the memory device 100, the commands and addresses can be decoded and memory operations can be performed. The command signals CMD can be provided as internal command signals ICMD to a command decoder 115 via the command/address input circuit 105. The command decoder 115 can include circuits to decode the internal command signals ICMD to generate various internal signals and commands for performing memory operations. The command decoder 115 can further include one or more registers 117 for tracking various counts or values. The memory device 100 can also include a refresh controller 112 to control the refresh of the memory array 150 based on commands from the command decoder 115. The refresh controller 112 can also include registers (not shown in FIG. 1) for tracking various counts or values (e.g., counts of refresh commands received by the memory device 100 or self-refresh operations performed by the memory device 100). It will be appreciated that the various partitions and functional blocks described herein are merely illustrative to enable an understanding of the disclosed technology and memory device 100 can be implemented with functionalities residing in different blocks and different logical partitions.

The power supply terminals may be supplied with power supply potentials VDD and VSS. These power supply potentials VDD and VSS can be supplied to an internal voltage regulator/generator circuit 170. The internal voltage regulator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

Input buffers included in the clock input circuit 120 can receive the external clock signals. For example, an input buffer can receive the CK and CKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

To refresh all the DRAM cells or memory device 100 within the allotted refresh period, a Refresh command (REF) must be issued at the average periodic refresh interval time (tREFI). For example, in some embodiments when CS_n (inverse of CS in FIG. 1), RAS_n/A16 and CAS_n/A15 are held Low, and WE_n/A14 and ACT_n (not shown in FIG. 1) is held High at the rising edge of the clock (CK), memory device 100 can enter a Refresh cycle. In some embodiments, the Refresh cycle is entered by decoding the C/A bus without use of RAS, CAS, and WE inputs. All banks of the memory device 100 must be precharged and idle for a minimum of the precharge time tRP(min) before the Refresh Command (REF) can be applied. The refresh addressing is generated by the internal refresh controller 112. This makes the address bits inconsequential (e.g., they may be assigned a logic value of "Don't Care") during a Refresh command. An internal address counter supplies the addresses during the refresh cycle. No control of the external address bus is required once this cycle has started. When the refresh cycle has completed, all banks of the memory device 100 will be in the precharged (idle) state. A delay between the Refresh Command and the next valid command, except DES, must be greater than or equal to the minimum Refresh cycle time tRFC(min) where the tRFC timing parameter depends on memory density.

In general, a Refresh command (REF) needs to be issued to the memory device 100 regularly every tREFI interval. To allow for improved efficiency in scheduling and switching between tasks, some flexibility in the absolute refresh interval is provided for postponing and pulling-in refresh command. For example, a maximum of 8 Refresh commands can be postponed when memory device 100 is in 1× refresh mode; for 2×/4× refresh mode, 16/32 Refresh commands can be postponed respectively during operation of the memory device 100, meaning that at no point in time more than a total of 8,16,32 Refresh commands are allowed to be postponed for 1×,2×,4×Refresh mode respectively. When 8 Refresh commands are postponed in a row, the resulting maximum interval between the surrounding Refresh commands is limited to 9×tREFI. Additionally, a maximum of 8 additional Refresh commands can be issued in advance ("pulled in") in 1×refresh mode and for 2×/4× refresh mode, 16/32 Refresh commands can be pulled in respectively, with each one reducing the number of regular Refresh commands required later by one. Pulling in more than 8/16/32 Refresh commands in advance does not further reduce the number of regular Refresh commands required later. The resulting maximum interval between two surrounding Refresh commands is limited to 9×tREFI where 8 refresh commands are pulled in.

The memory device 100 can be connected to any one of several electronic devices capable of utilizing memory for the temporary or persistent storage of information, or a component thereof. For example, a host device of memory device 100 can be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device can be a networking device (e.g., a switch, a router, etc.) or a recorder of digital images, audio and/or video, a vehicle, an appliance, a toy, or any one of several other products. In one embodiment, the host device can be connected directly to memory device 100, although in other embodiments, the host device can be indirectly connected to memory device (e.g., over a networked connection or through intermediary devices).

Figure 2:
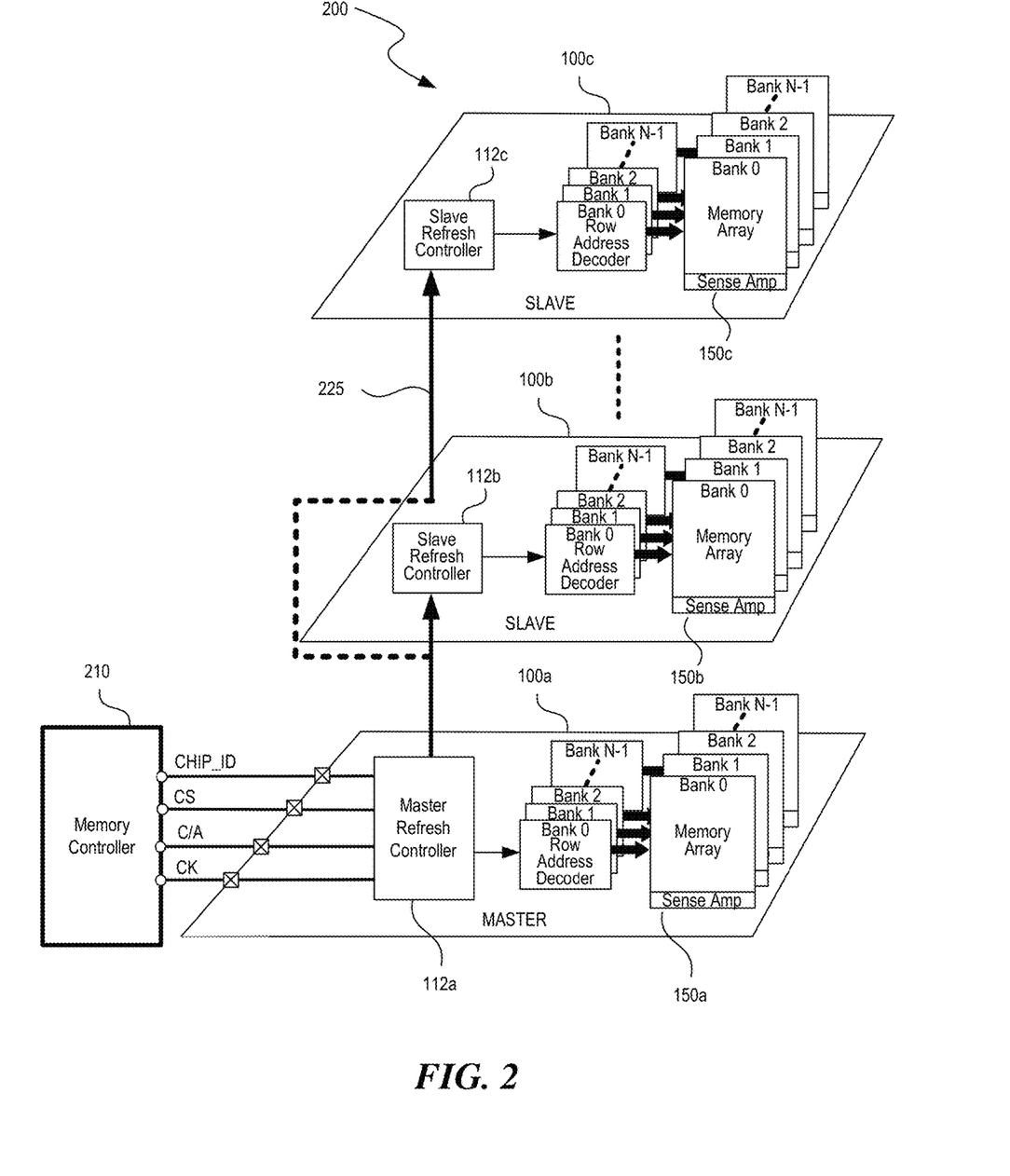
FIG. 2 is a representative block diagram schematically illustrating a three-dimensional stacked (3DS) memory device.

FIG. 2 is a representative block diagram 200 schematically illustrating a three-dimensional stacked (3DS) memory device 200. The 3DS memory device 200 comprises several stacked memory devices, e.g., memory devices 100a, 100b, and 100c interconnected through, for example, through-silicon via (TSV) or through-chip via interconnect. In the 3DS memory device 200, each of the component memory devices 100a, 100b, and 100c can be configured to operate as a master memory device (e.g., memory device 100a) or as slave memory devices (e.g., memory devices 100b and 100c). Only the master memory device 100a interfaces with the external memory controller (e.g., memory controller 210) or host controller; the slave devices are controlled by the memory controller 210 through the master device 100a. That is, memory controller instructions to the slave memory devices 100b and 100c pass through and are "filtered" by the master memory device 100a (e.g., memory devices of a slave type receive commands or control information from a memory devices of a master type). In some embodiments, both the master device (e.g., master device 100a) and the slave devices (e.g., slave devices 100b and 100c) have similar hardware components except that the slave devices are configured to disable "master" functionality, e.g., via fuse configuration, packing bonding, or by programming via for example mode registers. In other embodiments, only master devices include hardware for "master functionality," e.g., hardware to interface memory controller 210, but the slave devices exclude the master logic and circuitry altogether.

Each of the master and slave devices in 3DS memory device 200 includes a memory array, for example, memory array 150a in the master device 100a, and memory arrays 150b and 150c in memory devices 100b, and 100c, respectively. As discussed above in relation to FIG. 1, DRAM memory arrays such as memory arrays 150a, 150b, and 150c need to be periodically refreshed to preserve the information in the memory arrays. To refresh the memory arrays 150a, 150b, and 150c, a Refresh command (REF) must be issued at an average periodic refresh interval time (tREFI) to each memory device 100a, 100b, and 100c. Memory controller 210 issues the REF command for each of the memory devices 100a, 100b, and 100c, but the REF commands for slave devices 100b and 100c are further retimed by the master device 100a as described below.

The master device 100a receives a REF command from the memory controller 210. In some embodiments, the REF cycle is entered when CS_n (inverse of CS in FIG. 1), RAS_n/A16 and CAS_n/A15 are held Low, and WE_n/A14 and ACT_n (not shown in FIG. 1) is held High at the rising edge of the clock (CK). In other embodiments, the Refresh cycle can be entered by decoding the C/A bus without use of RAS, CAS, and WE inputs. The master refresh controller 112a generates the addresses and timing to refresh memory array 150a. Additionally, the master device 100a receives REF commands targeted to slave devices 100b and 100c (e.g., where CS_n chipselect selects slave device 100b or 100c). As described further below, master device 100a determines whether to immediately send the REF command to the targeted slave device or whether and to what extent to delay the REF commands to the targeted slave device. In some embodiments, the master device 100a delays the REF command for a certain period before refreshing the targeted memory array (the targeted memory array can be the master array 150a or any of the slave arrays 150b and 150c). For example, if the refresh is targeted to a slave device, after the delay elapses, the master device 100a sends the REF command to the individual slave device where each slave devices refresh controller (e.g., refresh controller 112b corresponding to slave device 100b, and refresh controller 112c corresponding to slave device 100c, or other control logic in slave devices 100b and 100c configured to receive refresh commands from the master memory device and to initiate and/or control refresh operations to slave memory arrays) controls the timing and addressing of the refresh command. In other embodiments, the master refresh controller 112a generates the refresh addressing and after the delay elapses provides the addressing to slave device refresh controllers, e.g., via path 225. Additionally, in other embodiments, the master device 100*a* includes the master/slave logic for the 3DS stack including the refresh controller for the master and slave devices (i.e., slave refresh controller 112*b* and 112*c* are contained in the master device 100*a*). As described above, when the master device 100*a* receives REF commands targeted to slave devices, the master device 100*a* determines whether to immediately start a refresh operation to the targeted slave device or whether and to what extent to delay the start of the refresh operation to the targeted slave device.

Figure 3A:
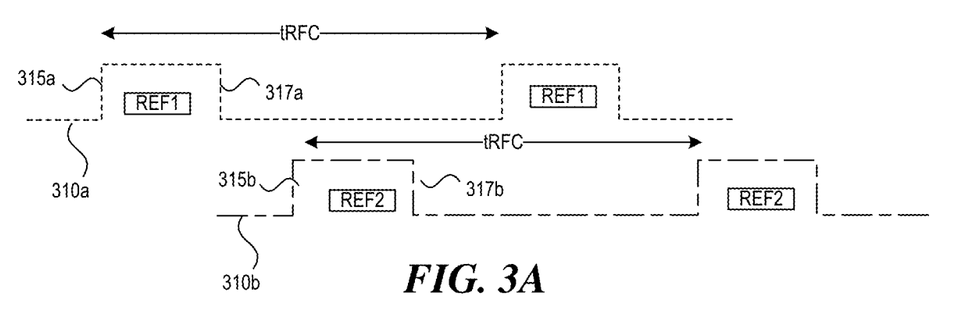
FIG. 3A is a representative plot illustrating example timing for non-overlapping refresh operations to DRAMs in different dies in a multi-die memory device.
Figure 3B:
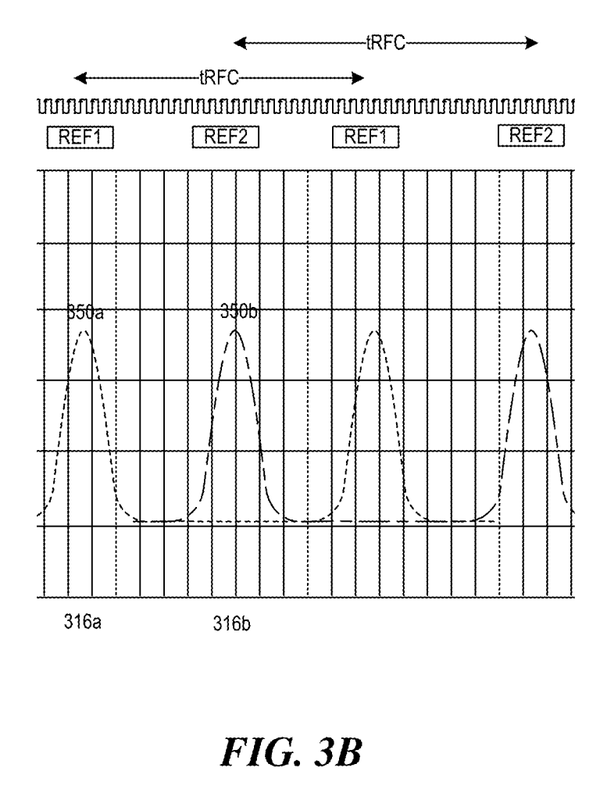
FIG. 3B is a representative plot illustrating example current profiles corresponding to non-overlapping refresh operations to DRAMs in different dies in a multi-die memory device.

FIG. 3A is a representative plot illustrating example timing for non-overlapping refresh operations to memory arrays in a monolithic device (e.g., memory device 100). A refresh operation involves activating and precharging tens to hundreds of rows in a short amount of time. Each activate and precharge is a comparatively high current operation which presents challenges in power distribution and noise immunity. On a monolithic device such as memory device 100, the refresh controller (e.g., refresh controller 112 in FIG. 1) manages the current spikes by staggering the internal timing of the activates to reduce the peak current demanded by the circuit. For example, memory controller 112 can refresh certain rows using timing 310*a*, and refresh other rows using timing 310*b*. The non-overlapping refresh operations based on timing 310*a* and 310*b* is achieved by staggering the internal timing of the activate commands to reduce the peak current demanded by the memory circuit. That is, at time 315*a* and 317*a* when the refresh to the first set of rows begins and ends (REF1), the second set of rows are not being refreshed; and at time 315*b* and 317*b* when the refresh to the second set of rows is ongoing (REF2), the first set of rows are not being refreshed. This non-overlapping timing in refresh operations results in non-overlapping peak currents as illustrated in FIG. 3B, a representative plot of the current profile, e.g., average current drawn during a refresh (IDD5), for periodic and repetitive refreshes. That is, at time 316*a* between times 315*a* and 317*a*, a peak current 350*a* results from the refresh operation on the first set of memory rows; at a time 316*b*, different from time 316*a*, a peak current 350*b* results from the refresh operation on the second set of memory rows. Because times 316*a* and 316*b* are sufficiently non-overlapping, peak currents 350*a* and 350*b* are not additive as would be the case if the refresh timing to the first and second set of rows overlapped.

Figure 4A:
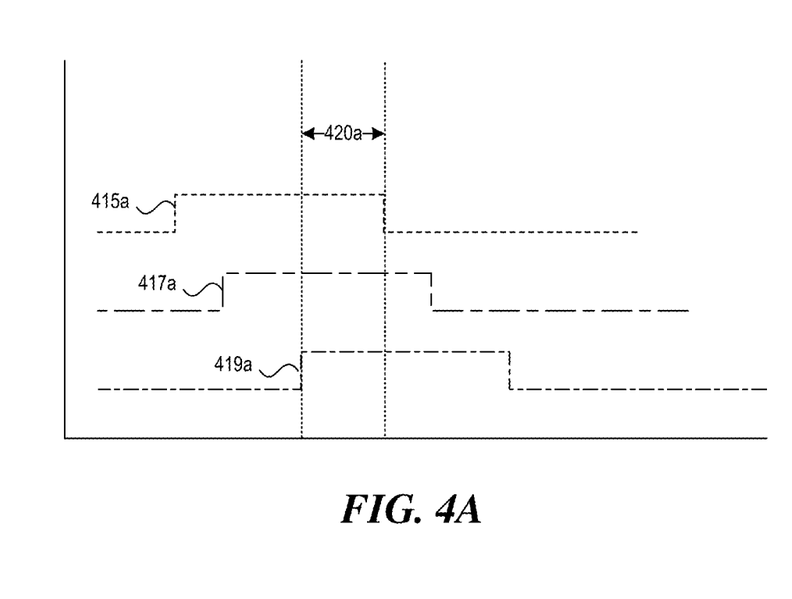
FIG. 4A is a representative plot illustrating example timing for overlapping refresh operations to DRAMs in different dies in a multi-die memory device.
Figure 4B:
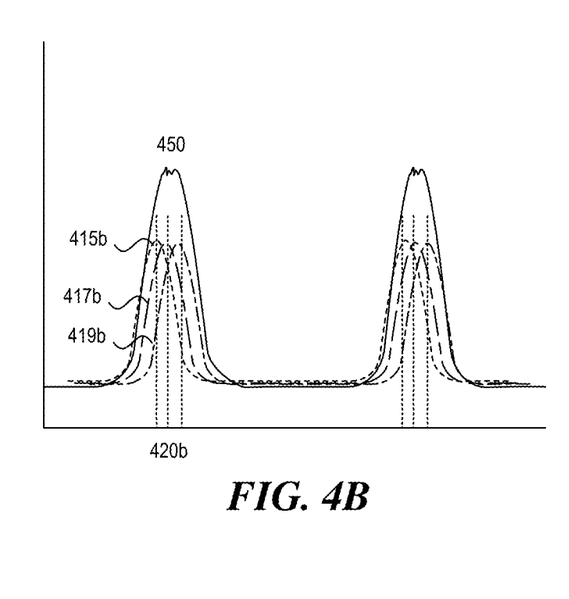
FIG. 4B is a representative plot illustrating example current profiles corresponding to overlapping refresh operations to DRAMs in different dies in a multi-die memory device.

FIG. 4A is a representative plot illustrating example timing for overlapping refresh operations to memory arrays in different dies in a multi-die memory device (e.g., memory device 200). For example, refresh timing 415*a* corresponds to refresh of memory array 150*a* in master memory device 100*a*; refresh timing 417*a* corresponds to refresh of memory array 150*b* in slave memory device 100*b*; and, refresh timing 419*a* corresponds to refresh of memory array 150*c* in slave memory device 100*c*. At time 420*a*, refresh to rows in memory arrays 150*a*, 150*b*, and 150*c* is concurrently active which leads to a large peak current 450 around time 420*b* as illustrated in FIG. 4B (time 420*b* corresponding to the high peak current falls around time 420*a* when memory arrays in different dies of the 3DS memory are simultaneously refreshing). For example, if each 3DS die/rank (e.g., memory devices 100*a*, 100*b*, and 100*c* in the 3DS device 200 of FIG. 2) must complete its refresh operation in 295 ns but can be issued a REF command every 95 ns, there can be cases when 3 dies or logical ranks are in refresh simultaneously as in period 420*a*.

FIG. 4B illustrates the individual current profiles (e.g., IDD5 average refresh currents) for each refresh operation described in relation to FIG. 4A; the current profile 415*b* from refreshing rows in memory array 150*a* based on refresh timing 415*a*; the current profile 417*b* from refreshing rows in memory array 150*b* based on refresh timing 417*a*; and the current profile 419*b* from refreshing rows in memory array 150*c* based on refresh timing 419*a*. As seen in FIG. 4B, the aggregate instantaneous peak current 450 for the 3DS memory can be higher than the peak currents 415*b*, 417*b*, and 419*b* to the separate memory arrays in the individual dies when the individual refresh cycles overlap as in period 420*a*. The high aggregate peak current 450 can affect data retention margins, timing circuits, signal integrity, and can require more power than the system can provide.

Figure 5:
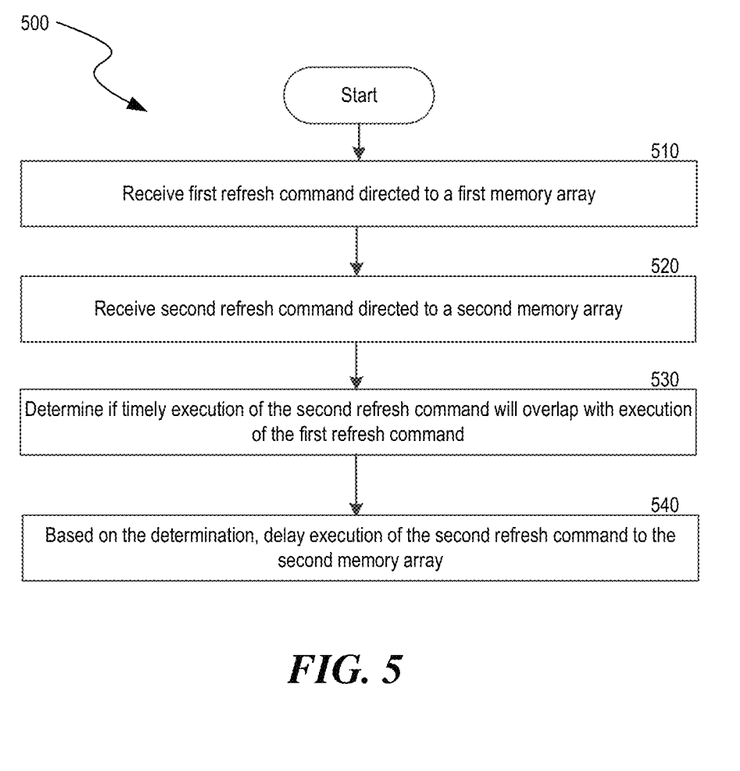
FIG. 5 is a representative flow illustrating an example method to retime refresh operations for memory arrays in DRAMs in different dies in a multi-die memory device.

FIG. 5 is a representative flow 500 illustrating an example method to retime refresh operations for DRAMs in different dies in a multi-die memory device (e.g., memory device 200). At block 510, the master DRAM (e.g., master device 100*a* in FIG. 2) receives a refresh command from the host, CPU or memory controller (e.g., memory controller 210 in FIG. 2) directed to a first memory array (e.g., any one of the memory arrays 150*a*, 150*b*, or 150*c* in FIG. 2). At block 520, the master device 100*a* receives a second refresh command to a different memory array in the 3DS stack. At block 530, the master device 100*a* determines if timely executing the second refresh command would overlap with execution of the first refresh command. That is, at block 530 the master device determines it executing the second refresh command within a time required by the specifications for the maximum refresh interval (e.g., tREFI) for the memory array relative to when the row of the memory array was last refreshed will result in the refresh overlapping with an ongoing refresh to a memory array of another die. For example, memory device 100*a*, on receiving the first refresh command to the first memory array at block 510 can commence or start execution of the refresh command to the targeted memory array and concurrently start a timer or counter. On receiving the second refresh command at block 520, memory device 100*a* can determine if the elapsed time or count since the start of the first refresh command is such that immediately allowing execution of the second refresh command would lead to overlap in refresh commands to different dies in the 3DS stack (i.e., rows in different arrays in different stacks would be simultaneously refreshing and hence consuming large amounts of peak current). In some embodiments, a free running timer or counter can be used to determine the relative times when refresh commands are received from the memory controller and issued by the master device and can be used to count the number of clock cycle delays required to delay execution of the received refresh commands.

At block 540, if allowing the execution of the second refresh command would lead to overlapping refresh operations, memory device 100*a* delays the execution of the second refresh command to the second memory array. In some embodiments, the amount of delay is based on when the second refresh command is received relative to when the execution of the first refresh command started and how long the refresh takes and is set such that execution of the second refresh command does not overlap with the execution of the first refresh command while ensuring that the delay is not too large to violate the maximum memory refresh period required to preserve the data in the memory array. For example, the master device 100*a* can determine the maximum amount of delay for the next refresh operation that is possible based on when the last previous refresh operation of the same rows of the same memory array occurred and further based on the required periodicity of row refresh required. The memory device 100a can also determine the minimum delay required to ensure no overlap between the execution of the second refresh and any ongoing refreshes. In some embodiments, the minimum delay is based at least in part on an operating characteristic of the 3DS memory device; or on a user-defined value (e.g., a value selected by a user in a programmable register); or on a multiple of a time period associated with refresh operations (e.g., if refresh operations take a time n for a given memory device, the minimum delay can be based on a multiple of n); or on the minimum delay that results in peak currents below a predetermined current threshold (e.g., where different preconfigurable amounts of delays result in different peak currents and a delay can be selected based on a minimum peak current target); or an industry specification (e.g., an industry specification based on one or more of the criteria above); or any combination thereof. Memory device 100a can select a delay value between the computed maximum and minimum delay (i.e., can select the maximum delay, the minimum delay, or a delay greater than the minimum and less than the maximum delay). In some embodiments, the delay is preconfigured or predetermined based on, for example, programmable register values, or based on some predetermined relationship based on other parameters and register values, or based on a hardcoded delay value (e.g., based on a fuse configuration, a logic circuit configuration, or other static/fixed signal determined at the time of manufacture or power-on). Additional details on how memory device 100a determines the amount of delay that is suitable is provided below in relation to FIG. 6.

Figure 6:
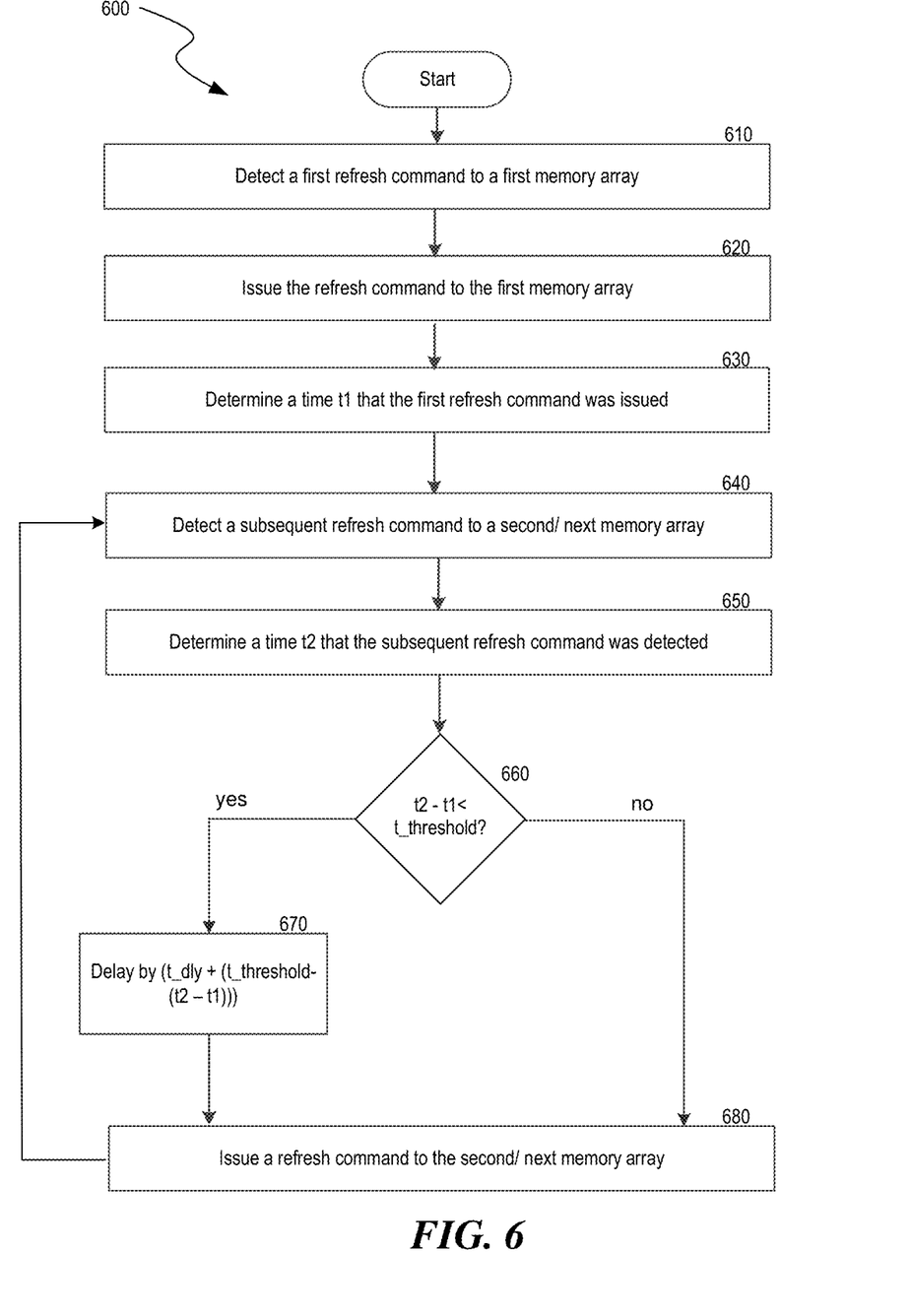
FIG. 6 is a representative flow illustrating an example method to retime refresh operations for DRAMs in different dies in a multi-die memory device according to another embodiment.

FIG. 6 is a representative flow 600 illustrating an example method to retime refresh operations for DRAMs in different dies in a multi-die memory device (e.g., memory device 200) according to another embodiment. At block 610, the master DRAM device (e.g., master device 100a in FIG. 2), detects a first refresh command to a first memory array. For example, the first refresh command can be a command to refresh rows of memory array 150a, or 150b, or 150c in FIG. 2. At block 620, the master device 100a issues the refresh command to the targeted memory array. For example, if the refresh command is targeted to rows in memory array 150a of master device 100a, master refresh controller 112a can generate the row addresses to refresh and can control the refresh of the memory array 150a. If, on the other hand, the refresh command is targeted to rows in memory arrays 150b or 150c of slave devices 100b or 100c, the master device can instruct the slave refresh controllers 112b or 112c to start refresh of the targeted rows of memory arrays 150b or 150c.

At block 630, the master device 100a determines a time, t1, when the first refresh command was issued (or when the first refresh operation commenced or was issued). Master device 100a can start a counter, zero out a running counter, or otherwise sample a time value coincident with issuing the first refresh command at block 620. Establishing the time that the first refresh command is issued, enables master device 100a determine the amount of time that has elapsed between the issuing of that refresh command and subsequent refresh commands. Knowing the elapsed time enables the master device 100a to determine if subsequent refresh commands would interfere with ongoing refresh operations. The master device 100a makes this determination on detecting a subsequent refresh command to a different memory array in block 640 (i.e., a memory array in another 3DS die in the stack), determining at block 650 a time, t2, when this subsequent refresh command is received from the memory controller or host, and determining, at block 660, if the elapsed time is less than a predetermined time threshold, t_threshold. For example, if at block 630, the time for issuing the first refresh command is determined by starting a counter with count values calibrated to denote time in ns, master device 100a can set t1 to 0 ns. Then at block 650, master device 100a can determine the current counter value, and determine a time of t2 ns since the counter was started. At block 660, master device 100a can then determine if t2 ns is less than a threshold delay value. The threshold delay value, t_threshold, is set to ensure no overlap between the first refresh and subsequent refreshes while ensuring that minimum refresh interval (tREFI) requirement is not violated. For example, if t_threshold is configured to 100 ns and t2 is determined in block 650 to be 50 ns, the master device 100a can determine at block 660 that t2−t1<100 ns and delay the issuance of the second refresh command as described further below.

If at block 660, master device 100a determines that the subsequent refresh command has come in too soon (i.e., that t2−t1<t_threshold), master device 100a delays, at block 670, the issuance of the subsequent refresh command at block 680. On the other hand, if at block 660 master device 100a determines that there is sufficient delay between when the first refresh command was issued and when the second refresh command is received (i.e., that t2−t1>t_threshold), it issues, at block 680, the second refresh command to the targeted memory array without further delaying the refresh command.

At block 670, the amount of delay can be a predetermined, calculated, or configurable number of clock cycles or time intervals and determines when master device 100a issues the received refresh command either targeted to the master device 100a's memory array 150a or to slave devices 100b or 100c's memory arrays 150b or 150c, respectively. In some embodiments, the delay can be made up of a fixed/configurable delay t_dly plus a delay corresponding to how much sooner the subsequent refresh command was received relative to the predetermined or configurable threshold t_threshold. For example, if t_dly is set to 2 ns (i.e., the refresh command to the second memory array must lag the completion of the execution of the first refresh command to the first memory array by 2 ns or the preconfigured time after completion of the first refresh operation to start the second refresh operation is 2 ns), and t_threshold is 100 ns, and the second refresh command is determined (at block 650) to have been received 50 ns after the first refresh command was issued at block 620 (i.e., t2=50 ns, t1=0 ns), master device 100a can delay issuing the second refresh command to the targeted memory by 52 ns (t_dly+(t_threshold−(t2−t1))). It will be appreciated that the values in the example above are merely illustrative and different values for t_dly and t_threshold can be selected that achieve the goal of ensuring that the subsequent refresh operation will not overlap in time with the first refresh operation (which leads to simultaneous high current demand from shared power rails). In some embodiments, the delay can be based at least in part on an operating characteristic of the 3DS memory device (e.g., peak currents), or can be a user defined value, or can be an industry specification, or any combination thereof. At block 670, master device 100a can execute the delay by, for example, starting a timer or counter (e.g., counting a number of clocks corresponding to the determined delay).

In some embodiments, the master device 100a can also delay internal activate or precharge for master or slave DRAMs to delay the start of refresh to those DRAMS. In other embodiments, the amount of delay incorporates the time required to refresh the memory array such that a subsequent refresh to another memory array is not started until the preceding refresh is complete. For example, for a preconfigured minimum non-overlap of 2 ns, memory device 100a can wait for the completion of the first refresh operation, wait 2 ns, and start the execution of the second refresh operation. In other embodiments, the amount of delay is based on target peak currents from overlapped refresh operations. That is, the delay is chosen to keep the peak aggregate current below a predetermined or preconfigured current threshold. In these embodiments, some amount of overlapping refresh operations can be allowed provided that the resulting peak refresh currents for the 3DS memory does not exceed some threshold peak current. At block 680, when the master device 100a issues or allows the execution of the refresh command, it can stop and reset the delay counter and start a new counter or timer corresponding to when it issued the second refresh command. In this case, the functions in blocks 640-680 are repeated when subsequent refresh commands (e.g., third, fourth, etc. refresh commands) are received by master device 100a.

Figures 7A, 7B:
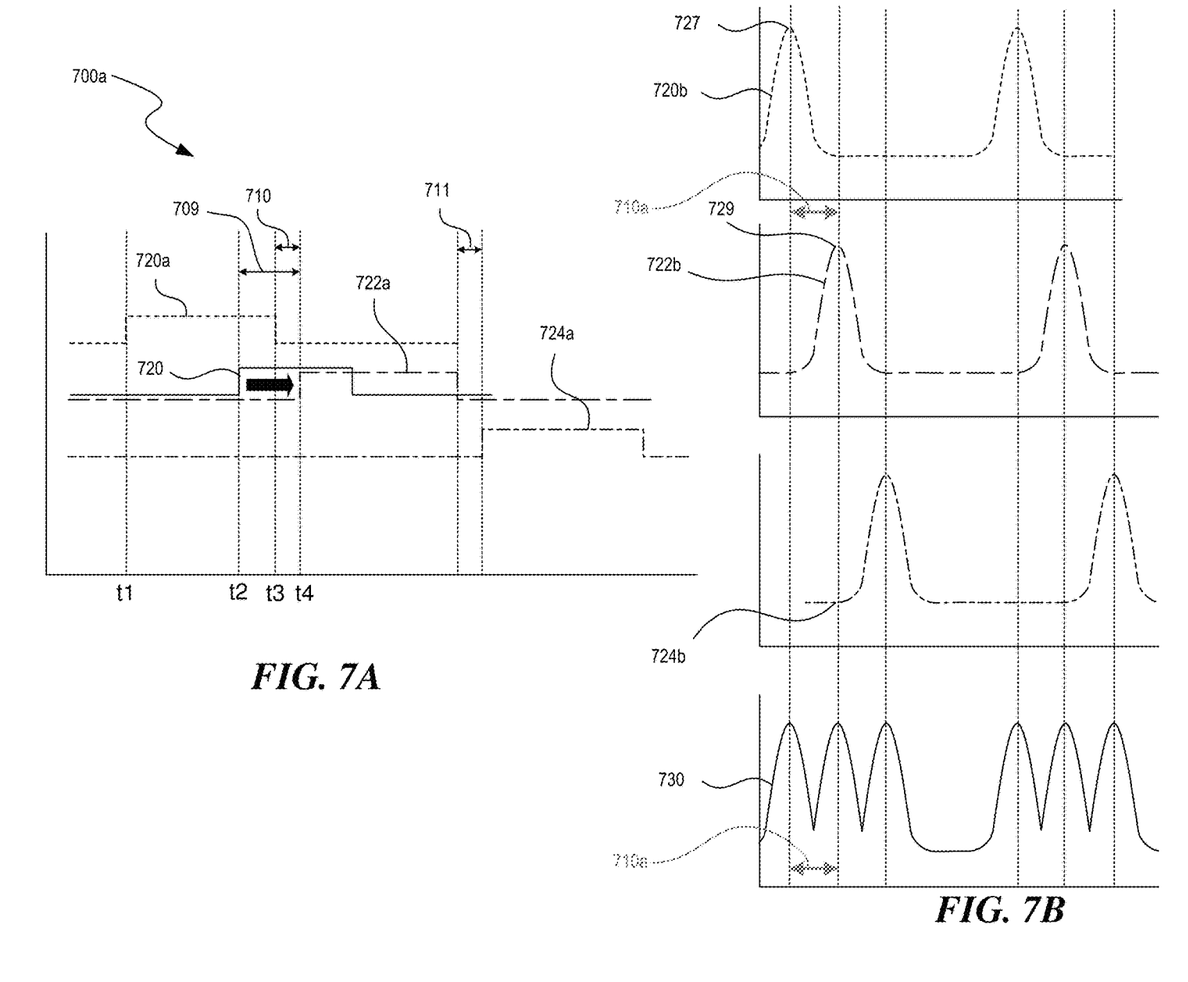
FIG. 7A is a representative plot illustrating retimed refresh operations for DRAMs in different dies in a multi-die memory device.
FIG. 7B is a representative plot illustrating current profiles corresponding to retimed refresh operations for DRAMs in different dies in a multi-die memory device.

FIG. 7A is a representative plot 700a illustrating retimed refresh operations for DRAMs in different dies in a multi-die memory device (e.g., memory device 200). Curves 720a, 722a, and 724a represents the retimed refresh timing to a first, second, and third memory array of different memory devices of the 3DS stack. For example, curve 720a can represent the refresh timing of master device 100a's memory array 150a, curve 722a can represent the refresh timing of slave device 100b's memory array 150b, and curve 724a can represent the refresh timing of slave device 100c's memory array 150c. Notably, plot 700a illustrates the example where the refresh to memory array 150b in accordance with timing 722a is delayed by a time 710 from the completion of refresh to memory array 150a; refresh to memory array 150c according to timing 724a is delayed by time 711 from the completion of refresh to memory array 150b, etc. The amount of delays 710 and 711 can be determined as described above in relation to block 670 of FIG. 6. That is, if curve 720 represents the second/subsequent refresh command detected in block 640 (FIG. 6), because immediately issuing the refresh command would have resulted in an overlap of refresh operations (and hence higher peak currents), at block 670 (FIG. 6) the timing 720 is delayed by a time delay 709 to timing 722a. For example, if the threshold time, t_threshold=t3 (in FIG. 7A), and time 710 (t4−t3) is the preconfigured delay, t_dly, described in relation to FIG. 6, the delay 709 is equal to t_dly+(t_threshold−(t2−t1)) or (t4−t3)+(t3−(t2−t1)). In some embodiments, the amount of delay is fixed and selected large enough to always allow for no overlap (or overlap below a predetermined minimum overlap time) between subsequent memory refresh commands. For example, if a memory refresh command typically takes x ns to complete, a fixed delay of y ns, where y>x can ensure that there is never an overlap of refresh commands to different memory arrays in the 3DS memory device. In other embodiments, the amount of delay is variable based on the time when the first refresh operation was started, a time when the first refresh operation is expected to complete, and further base on a preconfigured or predetermined static time indicating when, after completion of the first refresh operation, the second refresh operation can begin.

FIG. 7B is a representative plot illustrating current profiles corresponding to retimed refresh operations of FIG. 7A. Current profile 720b corresponds to refresh timing 720a (for refresh operations to a first memory device in the 3DS stack); current profile 722b corresponds to refresh timing 722a (for refresh operations to a second memory device in the 3DS stack); and current profile 724b corresponds to refresh timing 724a (for refresh operations to the first memory device in the 3DS stack). Current profile 730 represents the aggregate current consumed by the 3DS stack device (e.g., memory device 200 of FIG. 2). For example, this can be the current drawn from shared power rails. As seen in FIG. 7B, because there is a delay between refresh operations of different memory arrays in the stack, the peak currents are non-overlapping. For example, the peak current 727 to a first memory array is delayed by a time 710a from the peak current draw 729 for a second memory array. As a result, the aggregate current 730 peaks at roughly the same peaks of the individual current profiles 720b, 722b, and 724b instead of being a sum of the peak currents as in FIG. 4B when refresh cycles overlap in time.

While the present disclosure contains many representative examples, these should not be construed as limitations on the scope of any disclosed methods or of what can be claimed, but rather as descriptions of features that may be specific to embodiments of disclosed methods. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendices should not be understood as requiring such separation in all embodiments.

From the foregoing, it will be appreciated that specific embodiments of the present technology have been described herein for purposes of illustration, but that various modifications can be made without deviating from the scope of the technology. Further, while advantages associated with certain embodiments of the technology have been described in the context of those embodiments, other embodiments can also exhibit such advantages, and not all embodiments need necessarily exhibit such advantages to fall within the scope of the present technology. Accordingly, the present disclosure and associated technology can encompass other embodiments not expressly shown or described herein.

We claim:

1. A method comprising:
    receiving a first refresh command directed to a first memory array of a three-dimensional stacked (3DS) memory device;
    receiving a second refresh command directed to a second memory array of the 3DS memory device;
    determining that execution of the second refresh command will overlap in time with execution of the first refresh command;
    based on the determining, calculating a time period by which to delay the execution of the second refresh command in order to maintain a peak aggregate current of the 3DS memory device below a predetermined current threshold, and delaying the execution of the second refresh command by the calculated time period, wherein the time period is calculated to be a delay greater than a time required to perform an execution of a refresh command to a memory array of the 3DS memory device.

2. The method of claim 1, wherein calculating the time period further comprises:

computing a value of a maximum delay allowed before a next refresh operation to a row of the second memory array, wherein the maximum delay allowed is based on a time of a last previous refresh operation to the row of the second memory array and a maximum refresh interval of the second memory array; and computing a value of a minimum delay of the second refresh command to the second memory array, wherein the minimum delay is configured to maintain the peak aggregate current of the 3DS memory device below the predetermined current threshold;

wherein the time period is calculated to be the maximum delay, the minimum delay, or greater than the minimum delay and less than the maximum delay.

3. The method of claim 1, wherein the predetermined current threshold is user-configurable.

4. The method of claim 1, wherein calculating the time period comprises:

determining a minimum amount of delay for a peak refresh current of the 3DS memory device to be below the predetermined current threshold; and calculating the time period to be the determined minimum amount of delay.

5. A method comprising:

detecting, at a master memory device of a three-dimensional stacked (3DS) memory device, a first refresh command to a first memory array of the 3DS memory device;

issuing, by the master memory device, the first refresh command to the first memory array, wherein issuing the first refresh command commences execution of the first refresh command;

detecting, at the master memory device, a second refresh command to a second memory array of the 3DS memory device, wherein the second memory array is in a memory device different from a memory device of the first memory array;

determining that execution of the second refresh command will overlap in time with execution of the first refresh command;

based on the determining, calculating a time period by which to delay the execution of the second refresh command in order to maintain a peak aggregate current of the 3DS memory device below a predetermined current threshold; and delaying an execution of the second refresh command by the calculated time period, wherein the time period is calculated to be a delay greater than a time required to perform an execution of a refresh command to a memory array of the 3DS memory device.

6. The method of claim 5, wherein calculating the time period comprises:

determining a preconfigured delay by which the start of the execution of the second refresh command to the second memory array must lag the start of the execution of the first refresh command to the first memory array.

7. The method of claim 6, wherein the preconfigured delay is stored in a programmable register.

8. The method of claim 6, wherein the preconfigured delay is based at least in part on a fuse configuration or a logic circuit configuration of the master memory device.

9. An apparatus comprising:

a plurality of memory devices of a first type, wherein each one of the first type of memory devices comprises a first memory array configured to receive commands or control information from a second type of memory device; and a second type of memory device coupled to each one of the memory devices of the first type, wherein the second type of memory device comprises a second memory array, wherein the apparatus is configured to calculate a time period by which to delay a second refresh operation of any one of the first memory arrays or the second memory array in order to maintain a peak aggregate current of the apparatus below a predetermined current threshold, and to delay, by the calculated time period, the second refresh operation of any one of the first memory arrays or the second memory array when the second refresh operation would overlap in time with a first refresh operation of a different one of the first memory arrays or second memory array, wherein the time period is calculated to be a delay greater than a time required to perform an execution of a refresh command to a memory array of the 3DS memory device.

10. The apparatus of claim 9, wherein the second type of memory device further comprises a refresh controller configured to control a refresh operation of the second memory array and of each of the first memory arrays.

11. The apparatus of claim 9, wherein each one of the memory device of the first type comprises control logic configured to receive a refresh command from the second type of memory device and control a refresh operation of the corresponding first memory array in response to receiving the refresh command from the second type of memory device.

12. The apparatus of claim 9, wherein the second type of memory device is configured to receive a refresh command from a memory controller coupled to the second type of memory device.

13. The apparatus of claim 9, wherein the time period is greater than or equal to a preconfigured amount of delay.

14. The apparatus of claim 9, wherein the second type of memory device further comprises:

a timer; and a refresh controller coupled to the timer and configured to:

determine a first value of the timer when the second type of memory device issues the first refresh operation;

determine a second value of the timer when the second type of memory device receives a second refresh command;

determine that the difference between the second value of the timer and the first value of the timer is less than a threshold value; and in response to determining that the difference between the second value of the timer and the first value of the timer is less than the threshold value, calculating the time period and delaying the execution of the second refresh command by the time period.

15. The apparatus of claim 14, wherein calculating the time period is based at least in part on the difference between the second value of the timer and the first value of the timer, and further based on a preconfigured delay; and
   wherein delaying the execution of the second refresh command comprises starting execution of the second refresh command when the timer counts a value corresponding to the second value of the timer plus the time period.

16. The apparatus of claim 15 wherein the preconfigured delay is stored in a programmable register.

* * * * *